United States Patent [19]

Yokoyama et al.

[11] Patent Number: 4,956,681

[45] Date of Patent: Sep. 11, 1990

[54] TERNARY LOGIC CIRCUIT USING RESONANT-TUNNELING TRANSISTORS

[75] Inventors: Naoki Yokoyama, Atsugi; Masao Taguchi, Sagamihara, both of Japan

[73] Assignee: Fujitsu Limited, Kawasaki, Japan

[21] Appl. No.: 310,463

[22] Filed: Feb. 15, 1989

Related U.S. Application Data

[63] Continuation of Ser. No. 917,060, Oct. 9, 1986, abandoned.

[30] Foreign Application Priority Data

Oct. 9, 1985 [JP] Japan .................. 60-223690

[51] Int. Cl.$^5$ .................. H01L 27/12; H01L 45/00; H01L 49/02
[52] U.S. Cl. .......................... 357/4; 357/16; 357/57; 365/168
[58] Field of Search ............... 357/4, 16, 57; 365/168, 365/159; 331/115, 144; 307/322, 324

[56] References Cited

U.S. PATENT DOCUMENTS

| | | | |
|---|---|---|---|
| 3,089,039 | 5/1963 | Abraham | 307/280 |
| 3,155,845 | 11/1964 | Gruodis et al. | 307/335 |
| 3,660,678 | 5/1972 | Maley et al. | 307/209 |
| 3,996,484 | 12/1976 | Abraham | 307/286 X |
| 4,712,121 | 12/1987 | Yokoyama | 357/4 |

FOREIGN PATENT DOCUMENTS

| | | | |
|---|---|---|---|
| 2607940 | 9/1977 | Fed. Rep. of Germany | 357/4 SL |
| 52-105785 | 5/1977 | Japan | 357/4 SL |

OTHER PUBLICATIONS

Seidman, A. et al, *Electronics, Devices, Discrete and Integrated Circuits*, Merrill, 1977, p. 393.
Danner, D. R., "Reading of a Three-Position Switch . . .", IBM Tech. Disc. Bull, Sep. 1984, pp. 2305-2306.
N. Yokoyama et al., A New Functional, Resonant-Tunneling Hot Electron Transistor (RHET), Nov. 1985, Japanese Journal of Applied Physics, vol. 24, No. 11, pp. L853-L854.

*Primary Examiner*—Andrew J. James
*Assistant Examiner*—Sara W. Crane
*Attorney, Agent, or Firm*—Staas & Halsey

[57] ABSTRACT

A logic gate including a resonant-tunneling transistor and a resistor connected in series thereto. The resonant-tunneling transistor has a superlattice structure. The resonant-tunneling transistor may be a resonant-tunneling hot electron transistor or a resonant-tunneling bipolar transistor. The resonant-tunneling transistor conducts a current between a collector and an emitter. The current has one of at least three different current values in response to a base voltage of one of three different voltage values. The third current value is between the first and second current values, and a second voltage value is between the first and third voltage values. The logic gate outputs one of at least three states, a high state, a low state and a state approximately between the high and low states in response to a signal applied to the logic gate. The signal has an amplitude of one of the first to third voltage values. A logic circuit includes at least three connected resonant-tunneling transistors. The logic circuit maintains at least three states, a high state, a low state, and a state approximately between the high and low states in the respective three resonant-tunneling transistors in response to a pulse signal applied to a base of one of the resonant-tunneling transistors.

15 Claims, 10 Drawing Sheets

Fig. 2b  $V_{BE} \doteq 2E_x/q$

| $V_{IN}$ | $V_{OUT1}$ | $V_{OUT2}$ | $V_{OUT3}$ |
|---|---|---|---|
| LO | HI | MID | LO |
| MID | LO | HI | MID |
| HI | MID | LO | HI |

TERNARY LOGIC CIRCUIT USING RESONANT-TUNNELING TRANSISTORS

"This is a continuation of co-pending application Ser. No. 917,060 filed on Oct. 9, 1986 now abandoned."

BACKGROUND OF THE INVENTION

1. Field of the Invention

The present invention relates to a ternary (tristable) logic circuit having resonant-tunneling transistors, such as resonant-tunneling hot electron transistors (RHETs) and resonant-tunneling bipolar transistors (RBTs). More particularly, it relates to a tristable gate circuit, a latch circuit having tristates, and a memory cell having tristates.

2. Description of the Related Art

Binary logic circuits have been extensively used and the fact that logic circuits of e (a base of a natural logarithm, e=2.718), are ideal has been proved in theory. Theoretically, the performance of a ternary logic circuit is superior to that of a binary logic circuit, and therefore, attempts have been made to realize ternary logic circuits. The prior art ternary logic circuits are not used in practice, because of small margin, complex circuit arrangement, etc.

Conversely, the principle of a resonant-tunneling transistor, such as a RHET has long been known. Recently, due to advances in semiconductor processing technology, such as molecular beam epitaxy (MBE) and metal organic chemical vapor deposition (MOCVD), practical RHETs have been developed (e.g., "RESONANT-TUNNELING HOT ELECTRON TRANSISTORS (RHET): POTENTIAL AND APPLICATIONS", N. Yokoyama, et al, Japanese Journal of Applied Physics, Vol. 24, No. 11, November, 1985, pp. L853–L854).

SUMMARY OF THE INVENTION

An object of the present invention is to provide a ternary logic circuit with a simple circuit arrangement and stable operation, by using resonant-tunneling transistors.

According to the present invention, there is provided a logic gate including a resonant-tunneling transistor and a resistor connected in series thereto. The resonant-tunneling transistor operates such that a current flows between a collector and an emitter, and this one of at least three different current values, i.e., a first, a second, or a third value, in response to a base voltage having one of these different voltage values, i.e., a first, a second or a third value. The third current value lies between the first and second current values. The second voltage value lies between the first and third voltage values. The logic gate outputs one of at least three states having a high value, a low value, and a value approximately between the high and low values in response to a signal applied to the logic gate. The signal has an amplitude corresponding to one of the first to third voltage values.

The resonant-tunneling transistor may be a resonant-tunneling hot electron transistor or a resonant-tunneling bipolar transistor.

The second voltage value applied to the base may be approximately $2 \cdot E_X/q$, where $E_X$ is an energy level of a sub-band at a quantum well in a superlattice in the resonant-tunneling transistor, and q is the charge of carriers in the resonant-tunneling transistor. The first voltage may be lower than $2 \cdot E_X/q$. The third voltage may be higher than $2 \cdot E_X/q$.

The quantum well of the superlattice is formed between first and second barrier layers.

In addition, a logic gate according to the present invention can be provided where a resonant-tunneling transistor, connected in series with a resistor, receives an input signal of the logic gate at its base for conducting a current between a collector and an emitter through a superlattice layer. The input signal is one of three voltage ranges. The value of the current depends on the voltage value of the input signal. The current characteristic with respect to the input voltage value has a minimum current value, a local maximum current value at an input voltage corresponding to the resonant energy level, a local minimum current value, a first positive resistance characteristic between the minimum current value and the local maximum current value, a negative resistance characteristic between the local maximum current value and the local minimum current value, and a second positive resistance characteristic above the local minimum current value. The input voltage corresponding to the minimum current value is in the first voltage range, the input voltage corresponding to the local maximum current value is in the second voltage range, and the output voltage corresponding to the local minimum current value is in the third voltage range. The logic gate outputs an output signal having an output voltage within one of first, second, and third ranges which correspond respectively to the first, third and second input voltage ranges.

The input voltage value providing the local maximum current value is equal to approximately $2 \cdot E_X/q$.

The potential height of at least one of the first and second barrier layers is arranged so that the first, second and third output voltage values are separate from each other.

According to the present invention, there is also provided a logic circuit including at least three resonant-tunneling transistors connected in series and forming a closed loop.

The logic circuit has at least three states having a high value, a low value, and a value approximately between said high and low values, in three respective resonant-tunneling transistors in response to a pulse signal applied to a base of one of the resonant-tunneling transistors. The pulse signal has an amplitude corresponding to one of first to third voltage values.

According to the present invention, there is further provided a semiconductor memory device including a plurality of memory cells connected between a plurality of word lines and a plurality of bit lines in a matrix fashion. Each memory cell includes an a single gate and two series-connected gates. Both common connection points are operatively connected to the word lines and the bit lines through transfer gates. Each gate includes a resonant-tunneling transistor and a resistor connected in series with the resonant tunneling transistor. Each memory cell holds at least three states having a high value, a low value and a value approximately between the high and low values in response to a signal applied between the bit lines and word lines. The signal has an amplitude corresponding to one of the first to third voltage values.

The semiconductor memory device may further include a plurality of sense amplifiers. Each amplifier includes a single gate and two series-connected gates. Both common connection points are operatively connectable to the bit lines to receive data from the memory cell. Each gate includes a resonant-tunneling transistor and a connected in series with the resonant tunneling transistor.

A semiconductor memory device may further include a plurality of write amplifiers. Each amplifier includes a single gate and two series-connected gates. Both common connection points are operatively connectable to the bit lines to output data to be stored in the memory cells. Each gate includes a resonant-tunneling transistor and a resistor connected in series with the resonant tunneling transistor.

BRIEF DESCRIPTION OF THE DRAWINGS

Other objects and features of the present invention will be described below in detail with reference to the accompanying drawings, in which:

FIGS. 2a to 2c are graphs of an energy state of the resonant-tunneling transistor in FIG. 1a;

FIG. 3 is a graph of the characteristics of the resonant-tunneling transistor FIG. 1a;

FIG. 6b is a simplified circuit diagram of FIG. 6a; and

DESCRIPTION OF THE PREFERRED EMBODIMENTS

Before describing the preferred embodiments of the present invention, a description will be given of the principle of a resonant-tunneling transistor device.

Figure 1A:
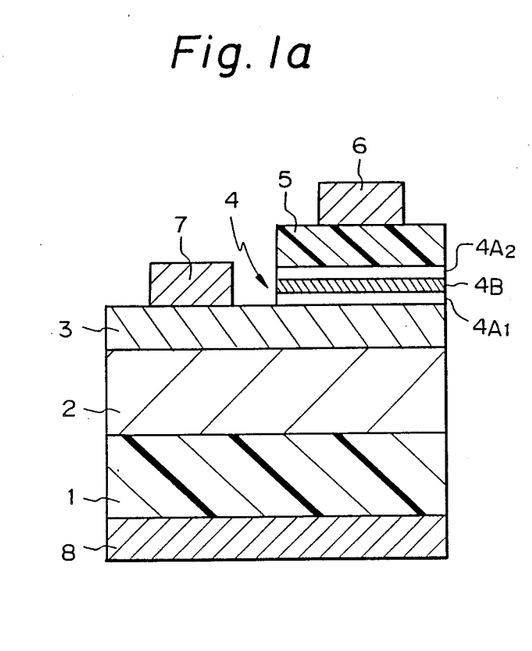
Figs 1a and 1b are views of a structure and an energy state of a resonant-tunneling hot electron transistor (RHET) respectively.
Figure 1B:
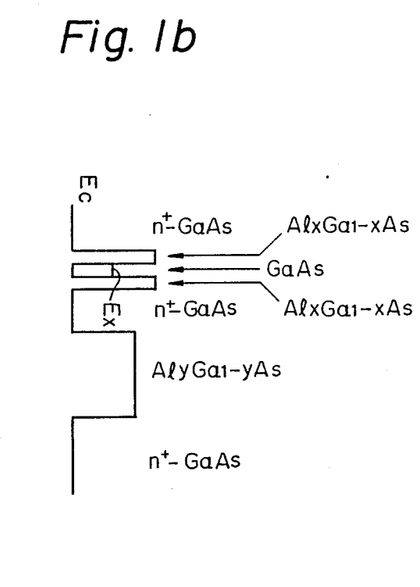

FIG. 1a is a sectional view of a semifinished RHET device, and FIG. 1b is a graph of an energy band of the RHET device in FIG. 1a. In FIG. 1a, the resonant-tunneling transistor device consists of a collector electrode 8, an n+-type GaAs collector layer 1, formed on the collector electrode 8, a non-doped impurity $Al_yGa_{1-y}As$ (e.g. y=0.3) collector side potential barrier layer 2 formed on the collector layer 1, an n+-type GaAs base layer 3 formed on the potential barrier layer 2, a superlattice layer 4, an n+-type GaAs emitter layer 5, an emitter electrode 6, and a base electrode 7. The superlattice layer 4 consists of a $Al_xGa_{1-x}As$ barrier layer $4A_1$, a non-doped impurity GaAs quantum well layer 4B, and an $Al_xGa_{1-x}As$ barrier layer $4A_2$. The superlattice layer 4 functions as an emitter side potential barrier. In this specification, the superlattice is defined such that at least one quantum well is provided therein. In FIG. 1a, a plurality of quantum wells may be formed.

In FIG. 1b, reference EC represents a bottom of a conduction-energy band, and EX an energy level of a sub-band of the quantum well.

Figures 2A, 2B, 2C:
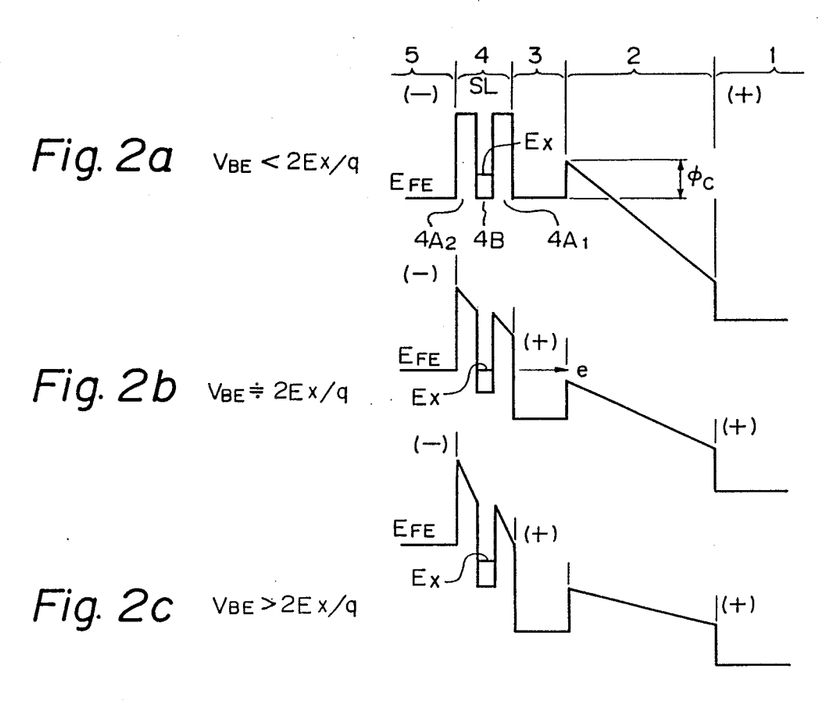

Referring to FIGS. 2a to 2c, the principle of the operation of the resonant-tunneling transistor device will be described.

FIG. 2a is a graph of an energy band of the RHET device when a voltage VBE between the base layer 3 and the emitter layer 5 is lower than $2 \cdot E_X/q$, wherein q represents the charge of the carriers, or is too low, for example, approximately zero volt. In FIG. 2a, although a voltage $V_{CE}$ exists between the collector layer 1 and the emitter layer 3, electrons at the emitter layer 5 cannot reach the base layer 3 by tunneling through the superlattice layer 4, since the base-emitter voltage $V_{BE}$ is approximately zero, and thus an energy level $E_{FE}$, that is a quasi-Fermi level, of the emitter layer 5 differs from the energy level $E_X$ at the sub-band. Accordingly, a current does not flow between the emitter layer 5 and the collector layer 1. Reference $\phi_C$ represents a conduction-band discontinuity.

FIG. 2b is a graph of an energy band of the RHET device when the base-emitter voltage $V_{BE}$ is approximately equal to $2 \cdot E_X/q$. In FIG. 2b, the energy level $E_{FE}$ at the emitter layer 5 is substantially equal to the energy level $E_X$ of the sub-band at the quantum well layer 4B. As a result, due to a resonant-tunneling effect, electrons at the emitter layer 5 are passed through the superlattice layer 4 and injected into the base layer 3. The potential energy of the injected electrons, for example, 0.3 eV, is converted to kinetic energy, the electrons being in a "hot" state. The hot electrons are ballistically passed through the base layer 3 and into the collector layer 1. As a result, a current flows between the emitter layer 5 and the collector layer 1.

FIG. 2c is a graph of an energy band of the RHET device when the base-emitter voltage $V_{BE}$ is higher than $2 \cdot E_X/q$. In FIG. 2c, the energy level $E_{FE}$ at the emitter layer 5 is higher than the energy level $E_X$ of the sub-band at the quantum well layer 4B. The resonant-tunneling effect does not occur, and the electrons introduced from the emitter layer 5 to the base layer 3 do not exist. Consequently, the current flowing into the RHET device is reduced. On the other hand, by decreasing the barrier height of the barrier layer $4A_1$ which is adjacent to the base layer 3 to a suitable value, the electrons may directly tunnel through the barrier layer $4A_2$, which is adjacent to the emitter layer 5. As a result, a certain amount of collector current may flow.

Figure 1C:
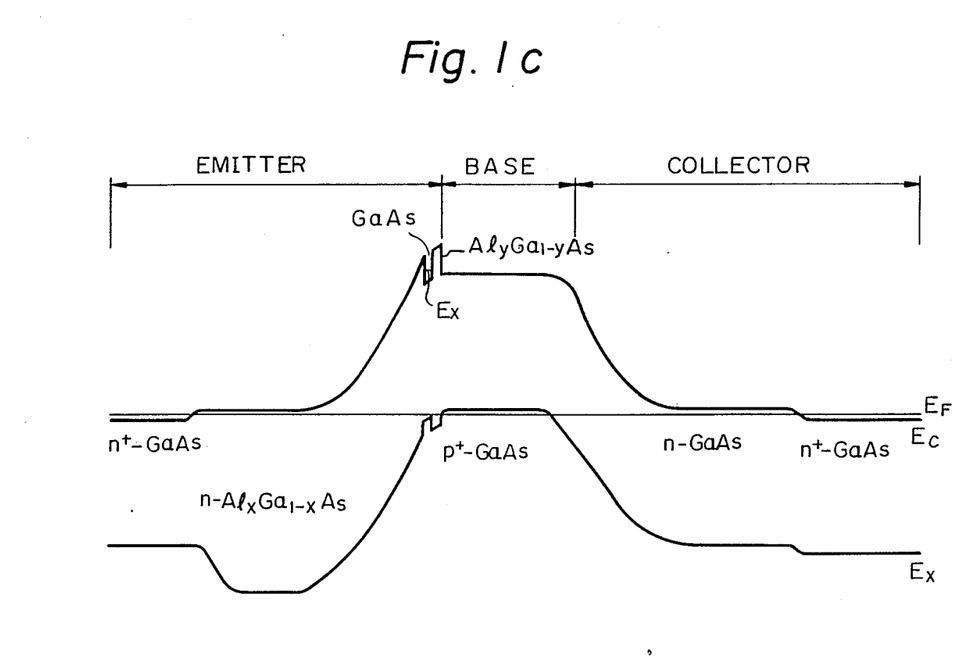
FIG. 1c is a view of an energy state of a resonant-tunneling bipolar transistor (RBT)

FIG. 1c is a graph of an energy band of a resonant-tunneling bipolar transistor (RBT). The RBT consists of an emitter layer of n+-type GaAs, a base layer of p+-type GaAs, and a collector layer of n+-type GaAs. The emitter layer includes a superlattice having at least one quantum well with a sub-band energy Ex. The base layer and the collector layer are PN-joined. The RBT also exhibits a resonant-tunneling effect and the principle of operation thereof is similar to that of the RHET, and thus, is omitted.

Figure 3:
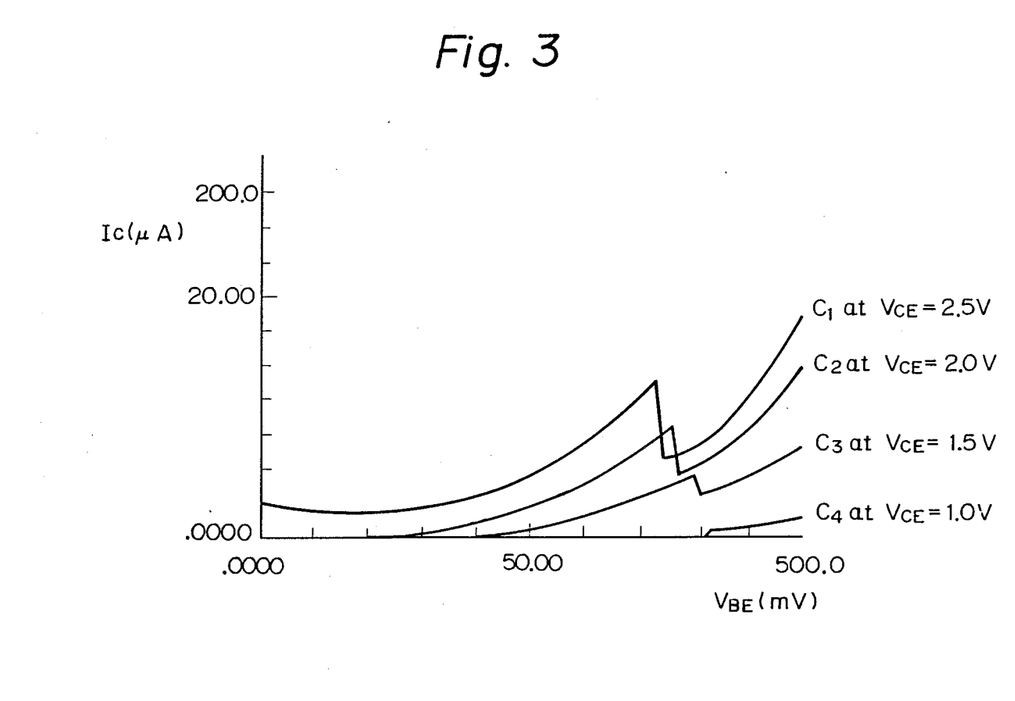

FIG. 3 is a graph of the characteristics of the RHET device set forth above. In FIG. 3, the abscissa indicates the base-emitter voltage $V_{BE}$ and the ordinate indicates the collector current $I_C$. Curves $C_1$ to $C_4$ represent the characteristics when the collector-emitter voltage $V_{CE}$ is respectively 2.5 V, 2.0 V, 1.5 V, and 1.0 V.

The curves indicate n-shaped differential negative-resistance characteristics. The present invention uses this feature to realize ternary logic circuits.

Figure 4:
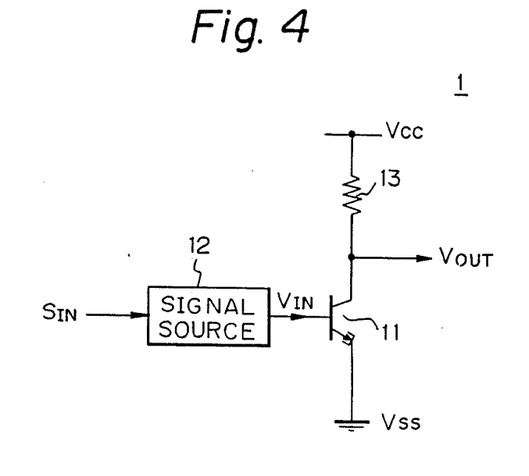
FIG. 4 is a circuit diagram of a first embodiment of a basic logic circuit according to the present invention.
Figure 5:
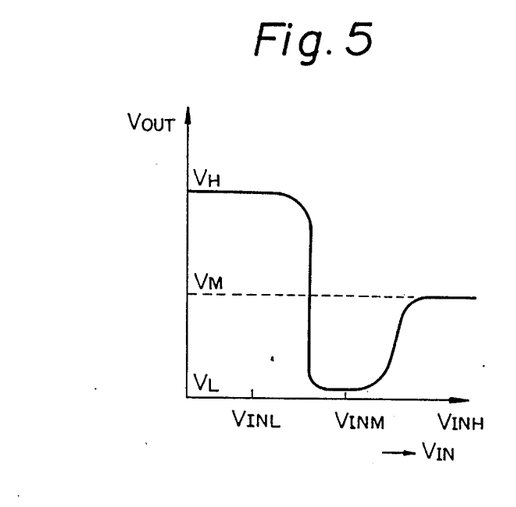
FIG. 5 is a graph of the operation of the logic circuit in FIG. 4.

Referring to FIGS. 4 and 5, a basic ternary logic circuit according to the present invention and the operation thereof will be described.

The logic circuit 1 include a RHET 11, a signal source 12 supplying an input voltage $V_{IN}$, i.e., base-emitter voltage $V_{BE}$, to a base of the RHET 11, and a resistor 13 connected to a collector of the resonant-tunneling transistor 11. An emitter of the RHET 11 is grounded. Another end of the resistor 13 is connected to a DC power supply having a volt $V_{CC}$. The signal source 12 outputs the voltage $V_{IN}$ having a value of $V_{INH}$ which is higher than $2 \cdot E_X/q$, $V_{INM}$ which is approximately equal to $2 \cdot E_X/q$, or $V_{INL}$ which is lower than $2 \cdot E_X/q$. Referring back to FIG. 3, preferably a minimum value of the collector current $I_C$ at a differential negative resistance region is half of a maximum value of the collector current due to the resonant-tunneling effect.

When the voltage $V_{IN}$ having a low value $V_{INL}$ is supplied to the base of the RHET, an output voltage $V_{OUT}$ at the collector of the RHET 11 is a high level $V_H$. When median voltage $V_{INM}$ is supplied to the base of the RHET, the output voltage $V_{OUT}$ is a low level $V_L$; when the high voltage $V_{INL}$ is supplied to the base of the RHET, the output voltage $V_{OUT}$ is a median level $V_M$. The truth table of the ternary logic circuit in FIG. 4 is as follows:

TABLE 1

| $V_{IN}$ | $V_{OUT}$ |
|---|---|
| Low | High |
| Median | Low |
| High | Median |

Figure 6A:
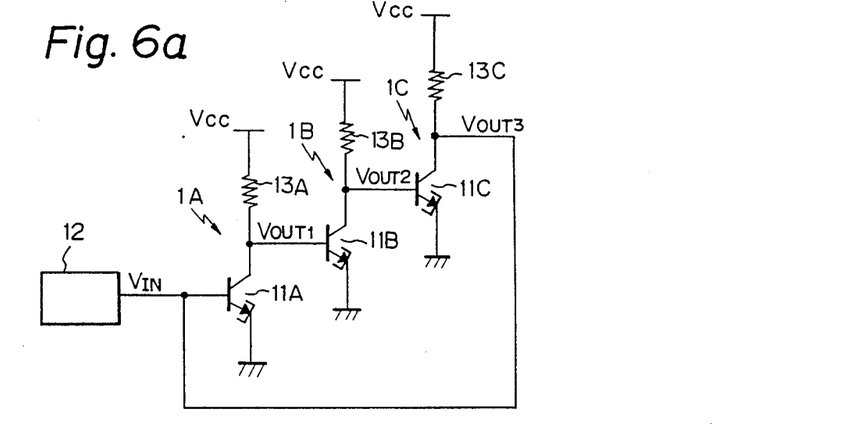
FIG. 6a is a circuit diagram of a second embodiment according to the present invention.
Figure 6B:
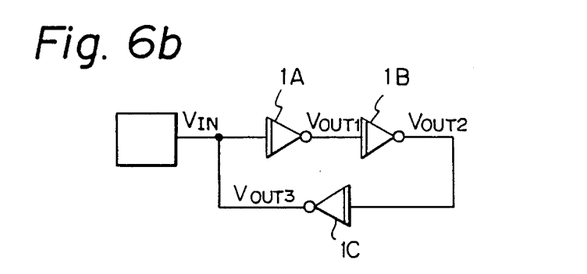

Referring to FIGS. 6a to 6b, a latch circuit using RHETs will be described.

In FIG. 6a, the latch circuit includes three series connected RHETs 11A, 11B, and 11C which form a loop, and three resistors 13A, 13B, and 13C. The signal source 12 is connected to the RHET 1A. FIG. 6b is a simplified view of the circuit in FIG. 6a.

Figure 6C:
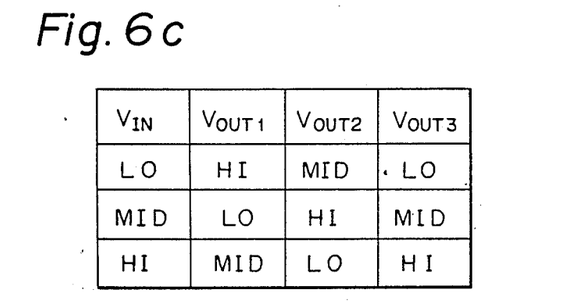
FIG. 6c is a truth table for the circuit in FIGS. 6a and 6b.

When the voltage VIN having the low level $V_{INL}$ ($V_{INL}=0$) is supplied to the RHET 11A, voltages $V_{OUT1}$ having a high level, $V_{OUT2}$ having a middle level and $V_{OUT3}$ having a low level are respectively output as shown in FIG. 6c. If the voltage $V_{IN}$ is changed to median level, a low level voltage $V_{OUT1}$, a high level voltage $V_{OUT2}$ and a median level voltage $V_{OUT3}$ are output. When the voltage $V_{IN}$ is high level, the voltages $V_{OUT1}$, $V_{OUT2}$, and $V_{OUT3}$ are median, low and high level, respectively. If the voltage $V_{IN}$ is changed to zero volts, the above voltage status is not changed. Then a pulse voltage having an amplitude of $V_{INL}$, $V_{INM}$ or $V_{INH}$ is supplied to the resonant-tunneling transistor 11A, and the RHETs 11A to 11C hold one of the conditions shown in FIG. 6c in response to the amplitude of the pulse voltage. As can be easily seen, the circuit in FIG. 6a functions as a tristable latch circuit.

Figure 7:
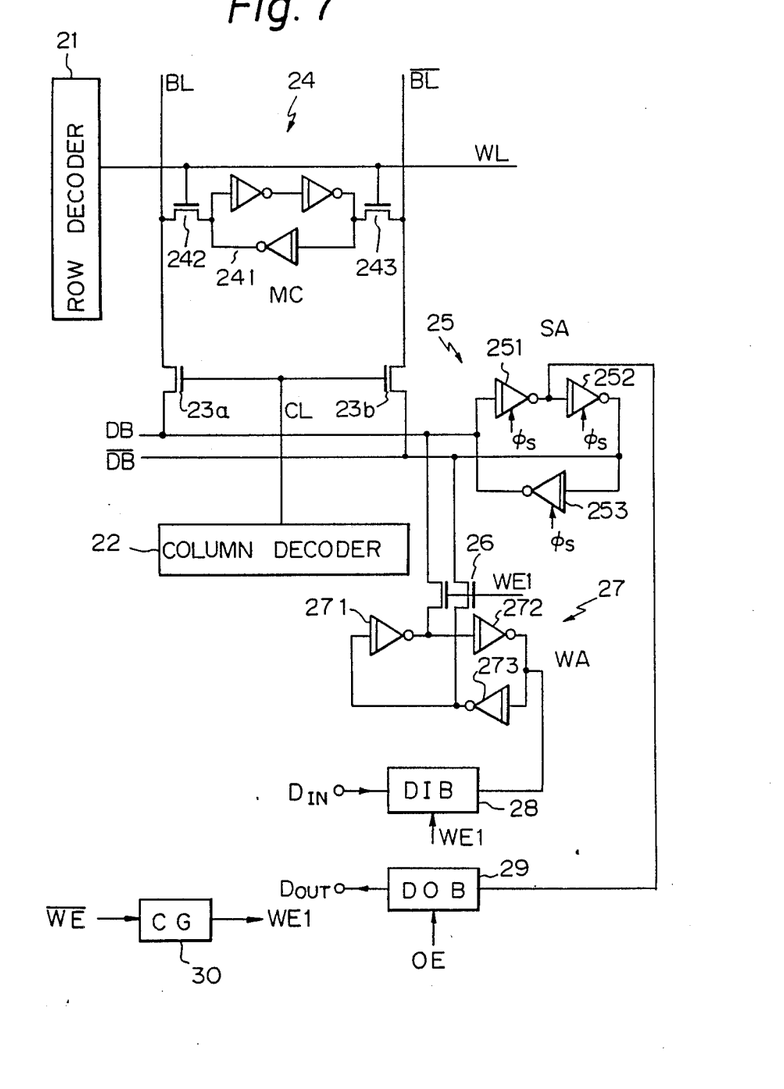
FIG. 7 is a circuit diagram of a third embodiment of a semiconductor memory device according to the present invention.

Referring to FIG. 7, still another embodiment will be described. FIG. 7 is a partial circuit diagram of a semiconductor memory device in which the RHETs are provided.

The semiconductor memory device includes a row decoder 21 connected to a word line WL, a column decoder 22 activating column gate transistors 23a and 23b connected between bit lines BL and $\overline{BL}$ and data buses DB and $\overline{DB}$, and a memory cell 24 connected between the word line WL and the bit line BL, and between the word line WL and the bit line $\overline{BL}$. The memory cell 24 consists of a latch circuit 241, as shown in FIGS. 6a and 6b, and transfer gates 242 and 243. The memory device also includes a sense amplifier 25 having three RHETs 251 to 253, a write amplifier 27 having three RHETs 271 to 273, and a pair of gate transistors 26 connected between the data buses DB and $\overline{DB}$ and the write amplifier 27. The memory device further includes a data input buffer 28, a data output buffer 29, and a clock generator 30.

Figure 8:
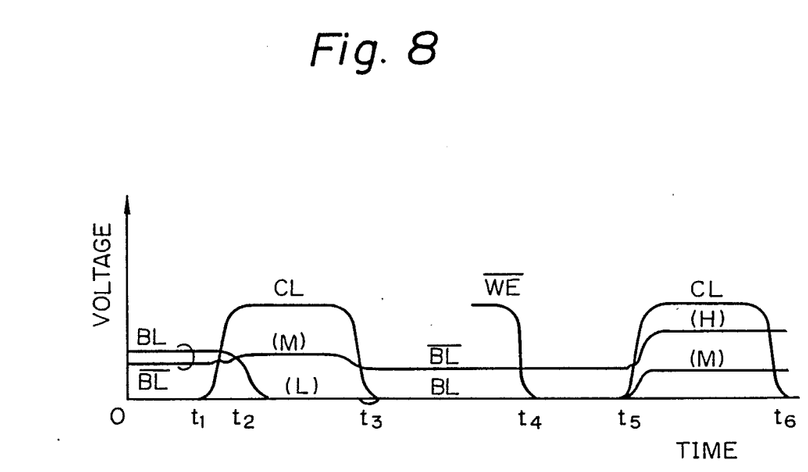
FIG. 8 is a graph of the operation of the semiconductor memory device FIG. 7.

Referring to FIG. 8, the operation of the memory device will be described. In FIG. 8, the abscissa represents a time, and the ordinate represents a signal voltage. References H, M, and L represent high level, middle level, and low level respectively of the resonant-tunneling transistor.

First, the read operation will be described. The read operation is carried out during times 0 to $t_1$. FIG. 8 represents a condition where the read operation was carried out for a memory cell (not shown) and the voltage equalization between the bit lines BL and $\overline{BL}$ was not fully completed, and therefore, a small voltage difference between the bit lines BL and $\overline{BL}$ still remains.

Upon receipt of an address signal, from an address buffer (not shown) that has received the address signal, the row decoder 21, the column decoder 22, the word line WL, and the column gate transistors 23a and 23b are selected, as shown in FIG. 8. At a time $t_1$, a column gate signal CL is raised to turn ON the column gate transistors 23a and 23b. The gates 242 and 243 are also turned ON. Voltage from the latch circuit 241 is transferred to the bit lines BL and $\overline{BL}$. The voltages on the bit lines BL and $\overline{BL}$ are high level, middle level, or low level. The voltages are further transferred to the sense amplifier 25 through the column gate transistors 23a and 23b and the data buses DB and $\overline{DB}$. At the time $t_2$, upon receipt of a sense strobe signal $\phi_S$, the sense amplifier 25 having a tri-stable flip-flop arrangement is activated to amplify the differential received voltage at a predetermined level. An output voltage amplified at the sense amplifier 25 is translated into a signal having a low impedance at the data output buffer 29, and output as an out data $D_{OUT}$ to an outside of a chip of the memory device by applying an output enable signal OE. The data output buffer 29 is a quad-state buffer having a fourth high impedance (Hi-Z) state in addition to the high, median, and low states of the conventional tristate buffer.

Next, the write operation will be described. Upon receipt of an external inverted write enable signal $\overline{WE}$ at the clock generator 30 at a time $t_4$, the column gate transistors 23a and 23b are turned ON at a time $t_5$. An input data $O_{IN}$ is supplied to the write amplifier 27, having a tristable flip flop arrangement, through the data input buffer 28 in response to an internal write enable signal WE1. The sense amplifier 27 has a larger drive capacity than the sense amplifier 25, but has a similar circuit construction. The amplified input data is transferred to the memory cell 24 through the gate transistors 26, the data buses DB and $\overline{DB}$, the column gate transistors 23a and 23b, and the bit lines BL and $\overline{BL}$. The input data is stored in the latch circuit 241 through the transfer gates 242 and 243. The content in the latch circuit 241 is one of three states.

Figure 9:
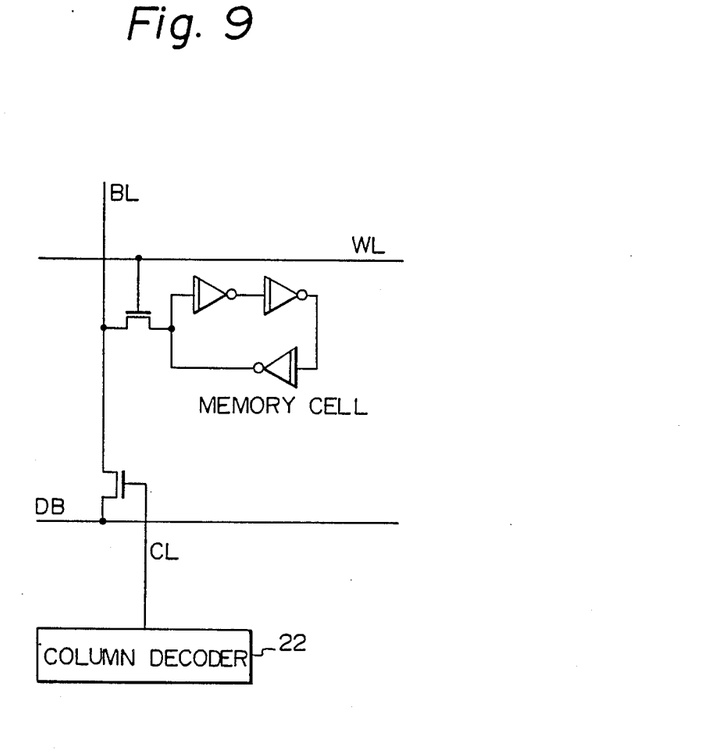
FIGS. 9 and 10 are modifications of the circuit in FIG. 8.

Referring to FIG. 9, a modified circuit of a single bit line BL and a single data bus DB is shown. This circuit increases the integration of IC devices, but has a lower operation speed.

Figure 10:
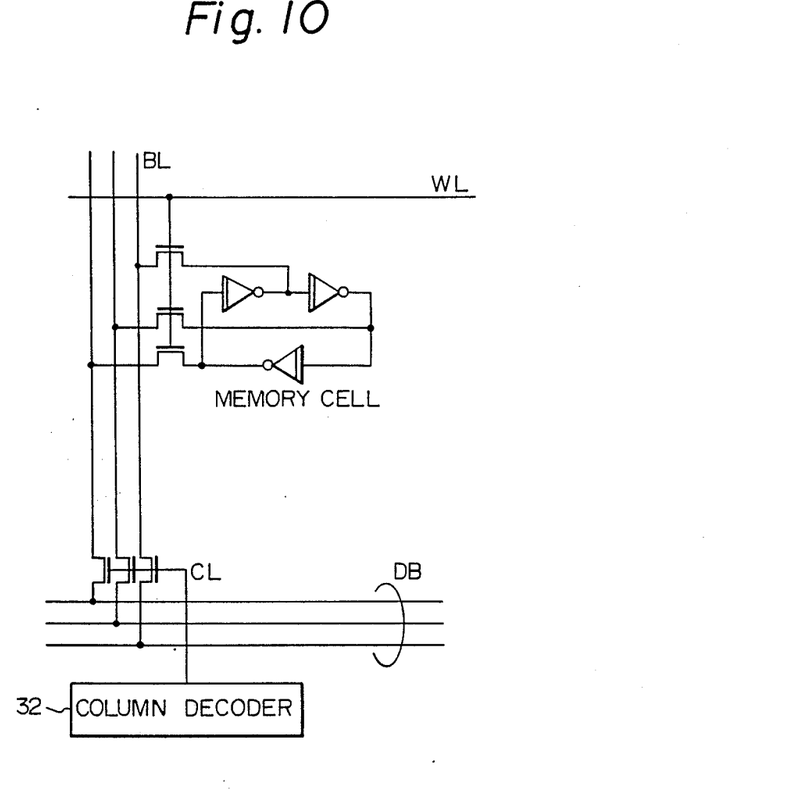

Referring to FIG. 10, another modified circuit having three bits lines BL and three data buses DB is shown.

This circuit improves the operation speed, but has a lower integration.

In the above embodiment, the tristate data input and output circuits are used. These can be changed by a tristate-to-bistate conversion circuit to adapt to conventional binary circuits. The conversion circuit is provided in a chip. The ternary signal processing is effected in the chip, and the conventional binary signal processing is effected outside of the chip. This circuit construction has a disadvantage in that a conversion time is required. The capacity of the memory is only 1.5 times that of a binary circuit, for example, a 64K cell array corresponds to a 96K cell array. That is, the advantage of a $2^n$ memory capacity cannot be obtained, and the memory addressing would be complex. Although it is inconvenient to provide the conversion circuit, an error checking and correction (ECC) circuit may be formed, because, for example, 64K cells substantially function as 96K cells.

Many widely different embodiments of the present invention may be constructed without departing from the spirit and scope of the present invention. It should be understood that the present invention is not limited to the specific embodiments described in this specification, except as defined in the appended claims.

We claim:

1. A logic circuit operatively connected to receive a pulse signal, comprising:

at least three resonant-tunneling transistors connected in series to form a closed loop, each said resonant-tunneling transistor having an emitter, a base, a superlattice formed between the emitter and the base and having a quantum well having at least one resonant energy level, and a collector, and having a negative resistance characteristic of a negative transfer conductance, each resonant-tunneling transistor conducting a current between the collector and the emitter, the current having one of at least three different current values including a first, a second or a third value, defined by said negative resistance characteristic and in response to a base voltage having one of three different voltage values including a first, a second or a third value, said third current value being between said first and second current values, and said second voltage value being between said first and third voltage values, said logic circuit holding at least three states, each state being, respectively, a high value, a low value, and a value approximately between said high and low values of said three resonant-tunneling transistors in response to the pulse signal applied to the base of one of said three resonant-tunneling transistors, the pulse signals having an amplitude of one of said first to third voltage values.

2. A logic circuit according to claim 1, wherein said second voltage value applied to the base is approximately $2 \cdot E_X/q$, wherein $E_X$ is an energy level of a sub-band at a quantum well in a superlattice in said resonant-tunneling transistor, and wherein q represents a charge on carriers in said resonant-tunneling transistor, said first voltage being lower than $2 \cdot E_X/q$ and said third voltage being higher than $2 \cdot E_X/q$.

3. A semiconductor memory device comprising:
a plurality of word lines;
a plurality of bit lines intersecting said word lines; and
a plurality of memory cells connected at the intersection of said word lines and bit lines in a matrix fashion, each one of said plurality of memory cells including three series connected gate circuits forming a closed loop; and transfer gates, operatively connected to said three series connected gate circuits and operatively connected to said word lines and said bit lines, each of said gate circuits including:

resonant-tunneling transistors having an emitter, base, a superlattice formed between the emitter and base and having a quantum well having at least one resonant energy level, and collector, and having a negative resistance characteristic of a negative transfer conductance; and a resistor operatively connected in series with said resonant-tunneling transistors, each of said resonant-tunneling transistors conducting a current between the collector and emitter, said current having one of at least three different current values including first, second, and third values defined by said negative resistance characteristic and in response to a base voltage having one of three different voltage values including first, second and third values, a third current value being between the first and second current values, and a second voltage value being between the first and third voltage values, each one of said memory cells holding at least three states, a high state, a low state, and a state approximately between said high and low states, in response to a signal applied between said bit lines and word lines, said signal having an amplitude corresponding to one of said first to third voltage values.

4. A semiconductor memory device according to claim 3, wherein said second voltage value applied to the base of said resonant-tunneling transistor is equal to approximately $2 \cdot E_X/q$, wherein $E_X$ is an energy level of a sub-band at a quantum well in a superlattice in said resonant-tunneling transistor, wherein q represents a charge on carriers in said resonant-tunneling transistor, said first voltage being lower than $2 \cdot E_X/q$ and said third voltage being higher than $2 \cdot E_X/q$.

5. A semiconductor memory device according to claim 4, further comprising a plurality of sense amplifiers, each including three series-connected gate circuits operatively connectable to said bit lines for receiving data from said memory cells, each one of said gate circuits including:
a resonant-tunneling transistor; and
a resistor operatively connected in series with said resonant-tunneling transistor.

6. A semiconductor memory device according to claim 5, further comprising a plurality of write amplifiers, each amplifier including three series connected gate circuits, operatively connectable to said bit lines, for outputting data to be stored in said memory cells, each of said gate circuits including:
a resonant-tunneling transistor; and
a resistor operatively connected in series with said resonant tunneling transistor.

7. A logic gate according to claim 2, wherein said resonant-tunneling transistor comprises a resonant-tunneling hot electron transistor (RHET).

8. A logic gate circuit according to claim 2, wherein said resonant-tunneling transistor comprises a resonant-tunneling bi-polar transistor (RBT).

9. A logic gate circuit according to claim 6, wherein said resonant-tunneling transistor comprises a resonant-tunneling hot electron transistor (RHET).

10. A logic gate circuit according to claim 6, wherein said resonant-tunneling transistor comprises a resonant-tunneling bi-polar transistor (RBT).

11. A logic gate operatively connected to receive a signal, comprising:

a resonant-tunneling transistor having a base, an emitter, a collector, and a superlattice layer formed between the base and the emitter, the superlattice layer including at least one quantum well layer formed between first and second barrier layers, said quantum well layer having at least one resonant energy level, said resonant-tunneling transistor receiving an input signal at the base from said logic gate, said input signal being within one of three voltage ranges, a first voltage range, a second voltage range and a third voltage range, and conducting a current between the collector and the emitter through the superlattice layer, the value of the current depending on the voltage value of said input signal, and the characteristic of the current with respect to the input voltage value exhibiting a minimum current value, a first positive resistance characteristic between said minimum current value and said local maximum current value, a negative resistance characteristic between said local maximum current value and said local minimum current value, and a second positive resistance characteristic above said local minimum current value, the input voltage providing said minimum current value being in said first voltage range, the input voltage providing said local maximum current value being in said second voltage range, and the input voltage providing said local minimum current value being in said third voltage range; and a resistor operatively connected in series with said resonant-tunneling transistor, said logic gate outputting a terminal voltage of said resistor as an output signal having an output voltage within one of a first output voltage range, a second output voltage range and a third output voltage range, which respectively correspond to said first, third and second input voltage ranges, the potential height of at least one of said first and second barrier layers being arranged so that said first, second and third output voltage ranges are separate from each other.

12. A logic gate according to claim 11, wherein said potential height of at least one of said first and second barrier layers being arranged so that said local maximum current value is approximately twice said local minimum current value, and said minimum current value is approximately zero.

13. A logic gate according to claim 11, wherein said input voltage value having the local maximum current value is equal to approximately $2 \cdot E_X/q$, wherein $E_X$ is an energy level of a sub-band at a quantum well in the superlattice in said resonant-tunneling transistor, and wherein q represents charges on carriers in said resonant-tunneling transistor, said first input voltage range being lower than $2 \cdot E_X/q$ and said third input voltage range being higher than $2 \cdot E_X/q$.

14. A logic gate circuit according to claim 11, wherein said resonant-tunneling transistor comprises a resonant-tunneling hot electron transistor (RHET).

15. A logic gate circuit according to claim 11, wherein said resonant-tunneling transistor comprises a resonant-tunneling bi-polar transistor (RBT).

* * * * *